United States Patent
Chung et al.

(10) Patent No.: US 12,288,709 B2
(45) Date of Patent: Apr. 29, 2025

(54) VACUUM PROCESSING APPARATUS AND VACUUM PROCESSING METHOD USING THE SAME

(71) Applicants: Samsung Display Co., LTD., Yongin-si (KR); ULVAC, INC., Chigasaki (JP)

(72) Inventors: Kyung Hoon Chung, Seongnam-si (KR); Masao Nishiguchi, Chigasaki (JP); Daisuke Iwase, Chigasaki (JP); Ki Jun Roh, Cheonan-si (KR); Man Soo Jang, Anyang-si (KR)

(73) Assignees: SAMSUNG DISPLAY CO., LTD., Yongin-si (KR); ULVAC, INC., Chigasaki (JP)

(*) Notice: Subject to any disclaimer, the term of this patent is extended or adjusted under 35 U.S.C. 154(b) by 460 days.

(21) Appl. No.: 17/685,298

(22) Filed: Mar. 2, 2022

(65) Prior Publication Data
US 2022/0285179 A1    Sep. 8, 2022

(30) Foreign Application Priority Data
Mar. 3, 2021    (KR) .................. 10-2021-0028297

(51) Int. Cl.
    *H01L 21/67*      (2006.01)
    *H01L 21/677*     (2006.01)

(52) U.S. Cl.
    CPC .. *H01L 21/67715* (2013.01); *H01L 21/67173* (2013.01); *H01L 21/67184* (2013.01); *H01L 21/67712* (2013.01)

(58) Field of Classification Search
    CPC ......... H01L 21/67715; H01L 21/67173; H01L 21/67184; H01L 21/67712; H01L 21/67718; H01L 21/6776; H01L 21/67196; H01L 21/67155; H01L 21/67201; H01L 21/67346; H01L 21/67706; H01L 21/67778; H01L 21/6719; H01L 21/67161; H01L 21/67017; H01L 21/67069; H01L 21/67748; H01L 21/67751;
(Continued)

(56) References Cited

U.S. PATENT DOCUMENTS

| 9,136,476 B2 | 9/2015 | Chang et al. |
| 9,899,635 B2 | 2/2018 | Bangert et al. |

(Continued)

FOREIGN PATENT DOCUMENTS

| JP | 2017-214654 | 12/2017 |
| KR | 10-1119853 | 2/2012 |

(Continued)

*Primary Examiner* — Rudy Zervigon
(74) *Attorney, Agent, or Firm* — KILE PARK REED & HOUTTEMAN PLLC

(57) ABSTRACT

A vacuum processing apparatus including: a plurality of transport chambers arranged in order along a first direction; a plurality of process chambers connected to the transport chambers along a second direction that is perpendicular to the first direction; and a position conversion chamber connected to a first transport chamber among the transport chambers. The transport chambers include a rotational movement stage that rotates about a rotation axis that is perpendicular to the first direction and the second direction, and moves along a plane formed by the first direction and the second direction.

13 Claims, 5 Drawing Sheets

(58) Field of Classification Search
CPC . H01L 21/67745; C23C 14/042; C23C 14/34;
C23C 14/568; C23C 16/042; C23C 16/54;
C23C 16/45551; C23C 16/545; C23C
16/4412; C23C 16/4401
USPC .............. 118/719; 156/345.31, 345.32
See application file for complete search history.

(56) References Cited

U.S. PATENT DOCUMENTS

| | | | |
|---|---|---|---|
| 2009/0000908 A1* | 1/2009 | Brain | H01L 21/67715 |
| | | | 700/226 |
| 2009/0226610 A1* | 9/2009 | Koenig | C23C 14/56 |
| | | | 118/500 |
| 2012/0064728 A1* | 3/2012 | Yi | C23C 14/50 |
| | | | 438/758 |
| 2017/0005297 A1* | 1/2017 | Bangert | C23C 14/12 |
| 2017/0250379 A1* | 8/2017 | Verplancken | C23C 14/24 |
| 2020/0040445 A1* | 2/2020 | Heimel | C23C 14/12 |
| 2020/0243768 A1* | 7/2020 | Zang | H01L 21/67715 |
| 2022/0348415 A1* | 11/2022 | Li | H01L 21/67715 |

FOREIGN PATENT DOCUMENTS

| | | |
|---|---|---|
| KR | 10-1985922 | 6/2019 |
| KR | 10-2075525 | 2/2020 |

* cited by examiner

VACUUM PROCESSING APPARATUS AND VACUUM PROCESSING METHOD USING THE SAME

CROSS-REFERENCE TO RELATED APPLICATION

This application claims priority from and the benefits of Korean Patent Application No. 10-2021-0028297, filed on Mar. 3, 2021, which is hereby incorporated by reference for all purposes as if fully set forth herein.

BACKGROUND

Field

Embodiments of the invention relate generally to a vacuum processing apparatus and, more specifically, to a vacuum processing method using the same.

Discussion of the Background

When a plurality of processes in a vacuum state are performed on a plurality of substrates, such as a method of manufacturing a display device, there are many changes in a position of a carrier that mounts the substrate therein and moves each process chamber, and the more complex a movement path, the greater the number of chambers in process equipment, which causes a processing time to increase.

As the manufacturing process becomes more complex, the manufacturing time and manufacturing cost increase, thereby reducing the movement path of a carrier for transporting a substrate to be processed on which a plurality of processes are performed, and a method that can efficiently process the plurality of processes becomes important.

The above information disclosed in this Background section is only for understanding of the background of the inventive concepts, and, therefore, it may contain information that does not constitute prior art.

SUMMARY

Embodiments of the invention provide a vacuum processing apparatus and a vacuum processing method using the same, capable of efficiently processing a plurality of processes reducing a movement path of a carrier for transporting a substrate to be processed in which a plurality of processes are performed in a vacuum state and efficiently processing a plurality of processes.

Additional features of the inventive concepts will be set forth in the description which follows, and in part will be apparent from the description, or may be learned by practice of the inventive concepts.

An embodiment provides a vacuum processing apparatus including: a plurality of transport chambers positioned in order along a first direction; a plurality of process chambers connected to the transport chambers along a second direction that is perpendicular to the first direction; and a position conversion chamber connected to a first transport chamber among the transport chambers. The transport chambers include a rotational movement stage that rotates about a rotation axis that is perpendicular to the first direction and the second direction, and moves along a plane formed by the first direction and the second direction.

The transport chambers may be connected to each other through a first connection passage and a second connection passage that are spaced along the second direction.

The position conversion chamber may include a first position conversion chamber connected to the first transport chamber through a third connection passage that is aligned with the first connection passage along the first direction, and a second position conversion chamber connected to the first transport chamber through a fourth connection passage that is aligned with the second connection passage along the first direction.

The vacuum processing apparatus may further include a starting position positioned in the first position conversion chamber, and an end position positioned in the second position conversion chamber.

A carrier on which a substrate may be mounted sequentially passes through the transport chambers along the first direction from the starting position positioned in the first position conversion chamber, then may pass through the transport chambers in reverse order along a direction that is opposite to the first direction, and then may be transported to the end position positioned in the second position conversion chamber.

The transport chambers may include a first main transport path and a second main transport path, which are positioned on the rotational movement stage and are spaced apart from each other, the first main transport path may include a first main transport track and a second main transport track that are separated from each other, and the second main transport path may include a third main transport track and a fourth main transport track that are spaced apart from each other.

The process chambers may include a first process chamber and a second process chamber that are separated from each other along the second direction and connected to the first transport chamber, and the first process chamber and the second process chamber may each include a first subtransport path and a second subtransport path.

By first rotation of the rotational movement stage, the second subtransport path of the first process chamber may be aligned with the first main transport track in the second direction, and the first subtransport path of the second process chamber may be aligned with the third main transport track of the first transport chamber in the second direction.

By horizontal movement of the rotational movement stage, the second subtransport path of the first process chamber may be aligned with the second main transport track in the second direction, and the first subtransport path of the second process chamber may be aligned with the fourth main transport track of the first transport chamber in the second direction.

The position conversion chamber may include a first position conversion chamber and a second position conversion chamber, and the vacuum processing apparatus may further include a first load lock chamber connected to the first position conversion chamber, and a carrier transport chamber connected to the position conversion chamber.

A carrier may be transported from the carrier transport chamber to the first position conversion chamber in a first position state with a surface facing the first direction or the second direction, and then may be changed from the first position state to a second position state in which the surface faces a plane formed by the first direction and the second direction in the first position conversion chamber.

A substrate to be processed may be carried into the first load lock chamber in the second position state in which a treatment surface of the substrate faces a plane formed by the first direction and the second direction, and then is transported to the first position conversion chamber, and the substrate may be mounted on the carrier in the first position conversion chamber.

The substrate and the carrier may be changed from the second position state to the first position state in the first position conversion chamber.

The substrate and the carrier may move the transport chambers and the process chambers while maintaining the first position state.

The vacuum processing apparatus may further include a second load lock chamber connected to the second position conversion chamber, the substrate and the carrier may be transported to the second position conversion chamber through the first transport chamber to change from the second position state to the first position state within the second position conversion chamber, and the substrate and the carrier, which have been repositioned to the first position state, may be separated, to transport the substrate to the second load lock chamber and the carrier to the carrier transport chamber.

The vacuum processing apparatus may further include a plurality of mask storage chambers connected to the process chambers, and a mask return path positioned between the process chambers and the mask storage chambers.

The vacuum processing apparatus may further include a turnback chamber connected to a second transport chamber that is most spaced apart from the first transport chamber along the first direction among the transport chambers, and the turnback chamber may include a rotation stage and a turnback transport path positioned on the rotation stage.

Another embodiment provides a vacuum processing method using a vacuum processing apparatus, including: transporting the carrier from the carrier transport chamber to the first position conversion chamber in a first position state in which a surface of the carrier faces the first direction or the second direction; changing a position of the carrier such that the carrier is changed from the first position state to a second position state in which the surface faces a plane formed by the first direction and the second direction in the first position conversion chamber; carrying the substrate into the first load lock chamber in the second position state; transporting the carried substrate to the first position conversion chamber in the second position state; mounting the substrate on the carrier in the first position conversion chamber; changing the substrate and the carrier from the second position state to the first position state in the first position conversion chamber; rotating rotational movement stages of the transport chambers about a rotation axis that is perpendicular to the first direction and the second direction; and moving the rotational movement stages of the transport chambers along a plane formed by the first direction and the second direction.

The vacuum processing method may further include: transporting the substrate and the carrier into the transport chambers and the process chambers from a starting position positioned in the first position conversion chamber while maintaining the first position state; and transporting the substrate and the carrier to an end position positioned in the second position conversion chamber while maintaining the first position state.

The rotating of the rotational movement stages may include: aligning the second subtransport path of the first process chamber connected to each of the transport chambers with first main tracks of the transport chambers in the second direction; and aligning the first subtransport path of the second process chamber connected to each of the transport chambers and facing the first process chamber with third main transport track of the transport chambers in the second direction.

The horizontally moving of the rotational movement stages may include: aligning the second subtransport path of the first process chamber with a second main transport track that is adjacent to a first main transport track in the second direction; and aligning the first subtransport path of the second process chamber with a fourth main transport track adjacent to a third main transport track in the second direction.

According to the inventive concepts, it is possible to provide a vacuum processing apparatus and a vacuum processing method using the same, capable of efficiently processing a plurality of processes reducing a movement path of a carrier for transporting a substrate to be processed in which a plurality of processes are performed in a vacuum state and efficiently processing a plurality of processes.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
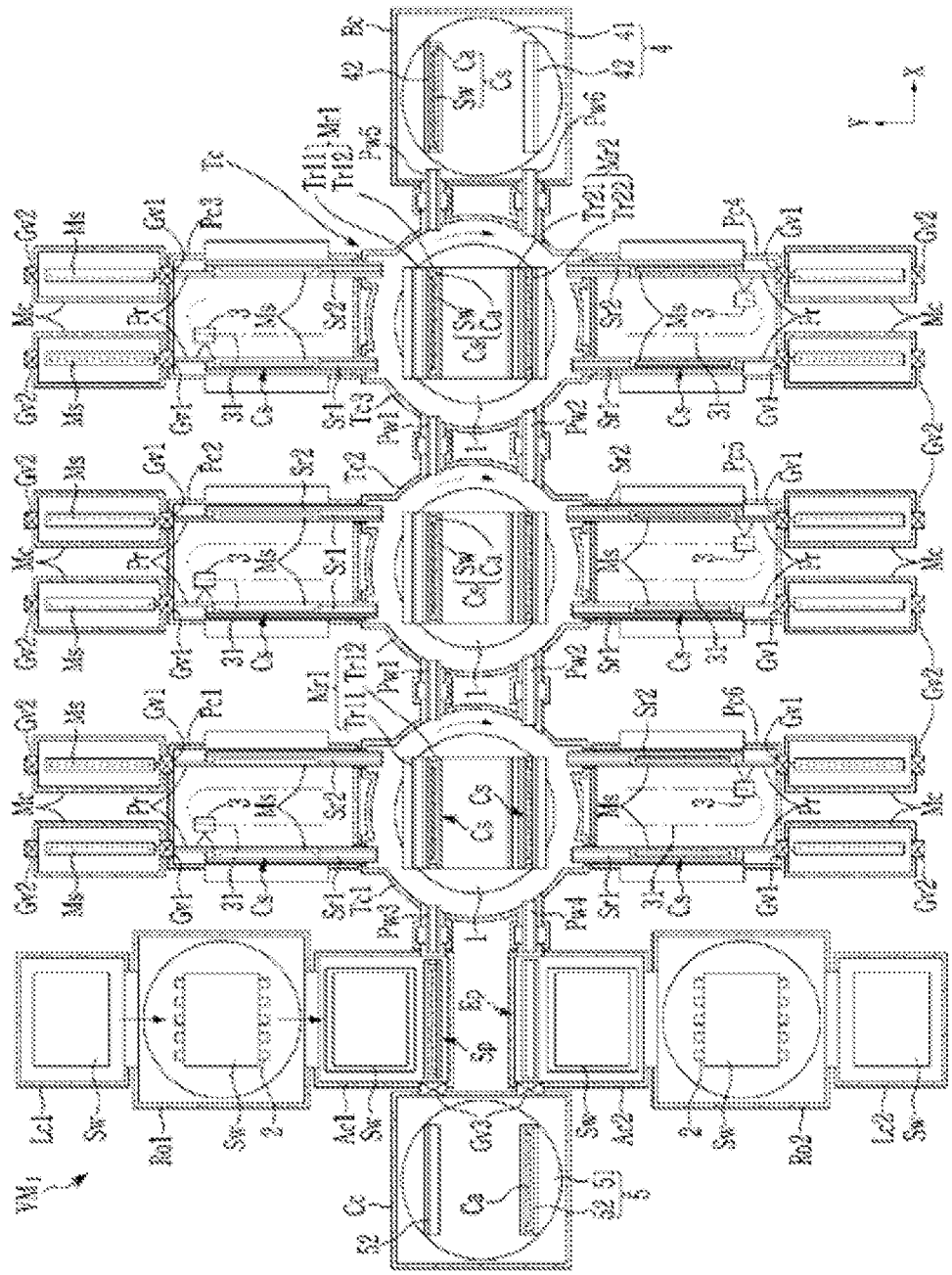
FIG. 1 illustrates a cross-sectional view of a vacuum processing apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A vacuum processing apparatus $VM_1$ according to an embodiment will be described with reference to FIG. 1. FIG. 1 illustrates a cross-sectional view of a vacuum processing apparatus according to an embodiment.

Hereinafter, two directions that are orthogonal to each other in one horizontal plane are referred to as a first direction X and a second direction Y, a position where a treatment surface of a substrate Sw faces in the first direction X or the second direction Y is referred to as a first position, e.g., a vertical position, and a position where the treatment surface of the substrate Sw faces a horizontal plane formed by crossing the first direction X and the second direction Y is referred to as a second position, e.g., a horizontal position.

Referring to FIG. 1, the vacuum processing apparatus $VM_1$ includes a carrier transport chamber Cc, a plurality of position conversion chambers Ac1 and Ac2, a plurality of load lock chambers Lc1 and Lc2, a plurality of robot chambers Ro1 and Ro2, a transport chamber Tc including Tc1, Tc2, and Tc3, a plurality of process chambers Pc1, Pc2, Pc3, Pc4, Pc5, and Pc6, a plurality of mask storage chambers Mc, a turnback chamber Bc, a plurality of rotational movement stages 1, a plurality of return robots 2, a plurality of processing devices 3, a transporter return means 4, and a carrier return means 5.

While a plurality of substrates Sw pass through the process chambers Pc1, Pc2, Pc3, Pc4, Pc5, and Pc6, thin films may be sequentially formed on the treatment surface of the substrates Sw by using a mask Ms.

The transport chamber Tc includes the transport chambers Tc1, Tc2, and Tc3 spaced apart along the first direction X, and the transport chambers Tc1, Tc2, and Tc3 are connected to each other by a plurality of first connection passages Pw1 and a plurality of second connection passages Pw2 that are spaced apart along the second direction Y.

A third connection passage Pw3 and a fourth connection passage Pw4 are positioned in a line along the first direction X with a first connection passage Pw1 and a second connection Pw2 on a side surface of the first transport chamber Tc1 among the transport chambers Tc1, Tc2, and Tc3, and the first transport chamber Tc1 is connected to the first position conversion chamber Ac1 and the second position conversion chamber Ac2 through the third connection passage Pw3 and the fourth connection passage Pw4.

A fifth connection passage Pw5 and a sixth connection passage Pw6 are positioned in a line along the first direction X with the first connection passage Pw1 and the second connection Pw2 on a side surface of the third transport chamber Tc3 among the transport chambers Tc1, Tc2, and Tc3, and the third transport chamber Tc3 is connected to the turnback chamber Bc through the fifth connection passage Pw5 and the sixth connection passage Pw6.

A first main transport path Mr1 and a second main transport path Mr2 are spaced apart from the first connection passage Pw1 and the second connection passage Pw2 along the second direction Y to extend along the first direction X.

A number of the transport chambers Tc1, Tc2, and Tc3 connected to each other is not limited, and may be appropriately changed in consideration of a device structure, a tact time, etc. Although not illustrated, the transport chamber Tc may be connected to an exhaust pipe connected to a vacuum pump, so that an inside thereof may be maintained to a vacuum atmosphere of a predetermined pressure.

A position of the first main transport path Mr1 in the first position conversion chamber Ac1 may be set as a starting position Sp, and a position of the second main transport path Mr2 in the second position conversion chamber Ac2 may be set as an end position Ep.

A carrier Ca on which the substrate Sw is mounted (hereinafter, also referred to as a transporter Cs') may sequentially pass through the transport chambers Tc1, Tc2, and Tc3 along the first direction X from the first main transport path Mr1 in the first position conversion chamber Ac1, which is the origin position Sp, may then pass through the turnback chamber Bc, pass through the transport chambers Tc1, Tc2, and Tc3 in an opposite order along a direction opposite to the first direction X, and then may be transported to the second main transport path Mr2 in the second position conversion chamber Ac2, which is the end position Ep.

According to the illustrated embodiment, it has been described that portions of the first position conversion chamber Ac1 and the second position change chamber Ac2 may serve as a portion of the transport chamber Tc, but the inventive concepts are not limited thereto, and it may also include an additional transport chamber including the starting position Sp and the end point position Ep. In addition, the first main transport path Mr1 and the second main transport path Mr2 may include other transport paths such as a subtransport path to transport the transporter Cs along the first main transport path Mr1 and the second main transport path Mr2 by magnetically levitating the carrier by a non-contact power supply. A detailed description thereof will be omitted.

A rotational movement stage 1 that is rotatable around a rotation axis extending in a direction that is perpendicular to the first direction X and the second direction Y and is movable on a plane formed by the first direction X and the second direction Y is installed in the transport chambers Tc1, Tc2, and Tc3, and the first main transport path Mr1 and the second main transport path Mr2 may be positioned on the rotational movement stage 1. The first main transport path Mr1 positioned on the rotational movement stage 1 includes two main transport tracks Tr11 and Tr12 disposed adjacent to each other, and the second main transport path Mr2 may include two main transport tracks Tr21 and Tr22 disposed adjacent to each other.

Although not illustrated, a predetermined operation mechanism may be provided in the first position change chamber Ac1 and the second position change chamber Ac2 to change a position of a carrier Ca positioned at the starting position Sp and the end position Ep between a first position (vertical position) and a second position (horizontal position).

A first robot chamber Ro1 and a second robot chamber Ro2 in which the vacuum return robots 2 each having a fork-shaped robot hand are respectively positioned on outer surfaces of the first position conversion chamber Ac1 and the second position conversion chamber Ac2 in a direction that is parallel to the second direction Y, and a first load lock chamber Lc1 and a second load lock chamber Lc2 are respectively connected through the first robot chamber Ro1 and the second robot chamber Ro2 to the first position conversion chamber Ac1 and the second position conversion chamber Ac2.

When the substrate Sw is carried into the first load lock chamber Lc1 to the second position (horizontal position), the substrate Sw is transported to the first position conversion chamber Arc1 through the first robot chamber Ro1 by the vacuum return robots 2 while having a second position, and is positioned on the carrier Ca having the first position by an operation mechanism at the starting position Sp, and constitutes the transporter Cs, which is the carrier Ca on which the substrate Sw is mounted.

Thereafter, the carrier Ca is repositioned to the first position (vertical position). In this case, a treatment surface of the substrate Sw may be positioned to face an inner surface of the first position conversion chamber Arc1.

However, a method of mounting the substrate Sw on the carrier Ca is not limited thereto, and may be changed. For example, the position of the substrate Sw in the first position conversion chamber Ac1 is changed from the second position to the first position, and in this state, the substrate Sw may be mounted on the carrier Ca positioned in the first position.

Although not illustrated, an exhaust pipe connected to a vacuum pump may be connected to each of the first position conversion chamber Ac1 and the second position conversion chamber Ac2, the first robot chamber Ro1 and the second robot chamber Ro2, and the first load lock chamber Lc1 and the second load lock chamber Lc2, to maintain an inside thereof in a vacuum atmosphere of a predetermined pressure.

The process chambers Pc1, Pc2, Pc3, Pc4, Pc5, and Pc6 for performing a process such as film formation on the treatment surface of the substrate Sw are respectively connected to outer surfaces of the transport chambers Tc1, Tc2, and Tc3 facing each other in the second direction Y.

Each of the process chambers Pc1, Pc2, Pc3, Pc4, Pc5, and Pc6 may have a same structure, and includes a first subtransport path Sr1 and a second subtransport path Sr2 spaced apart along the first direction X and extending in the second direction Y from each of the transport chambers Tc1, Tc2, and Tc3.

When the rotational movement stage 1 rotates 90 degrees clockwise, the first subtransport path Sr1 of the first process chamber Pc1, the second main transport path Mr2 of the first transport chamber Tc1, and the first subtransport path Sr1 of the sixth process chamber Pc6 are aligned along the second direction Y, and the second subtransport path Sr2 of the first process chamber Pc1, the first main transport path Mr1 of the first transport chamber Tc1, and the second subtransport path Sr2 of the sixth process chamber Pc6 are aligned along the second direction Y.

In this state, when the rotational movement stage 1 is moved by a predetermined stroke length along the first direction X, the two subtransport paths Sr1 and Sr2 aligned in the second direction Y may be aligned with any one of the main transport tracks Tr11 and Tr12 and any one of the main transport tracks Tr21 and Tr22. Accordingly, the transporter Cs may be exchanged between the first transport chamber Tc1, the first process chamber Pc1, and the sixth process chamber Pc6. In this case, the transporter Cs maintains a state in which the treatment surface of the substrate Sw faces an inner surface of each chamber.

Film formation members 3 may be positioned as processing members in the process chambers Pc1, Pc2, Pc3, Pc4, Pc5, and Pc6. The film formation members 3 may include various pieces of equipment, such as a deposition source, a sputtering cathode, and a process gas introduction member depending on a film formation method, such as a sputtering method, a deposition method, or a CVD method.

In addition, a guide rail 31 having, e.g., a U-shape, may be provided in the process chambers Pc1, Pc2, Pc3, Pc4, Pc5, and Pc6 to move the film formation members 3 along the guide rail 31 such that various processes, such as film formation, may proceed through the film formation members 3 throughout the entire surface of the treatment surface of the transporter Cs transported to a predetermined position therein along each of the subtransport paths Sr1 and Sr2. The film formation process, devices required therefor, and mechanisms for driving the same are not limited to a specific shape, and may be variously changed.

In addition, a plurality of mask storage chambers Mc, which are aligned in a line along the second direction Y with the subtransport paths Sr1 and Sr2, and accommodate the mask Ms, are positioned on an outer surface facing the transport chamber Tc along the second direction Y among outer surfaces of the process chambers Pc1, Pc2, Pc3, Pc4, Pc5, and Pc6, and the process chambers Pc1, Pc2, Pc3, Pc4, Pc5, and Pc6 may be respectively connected to the mask storage chambers Mc through a first gate valve Gv1.

The mask storage chambers Mc may have a same structure, and may be connected to an exhaust pipe connected to a vacuum pump and a vent gas line for injecting a vent gas, although not illustrated.

A mask transport path Pr extending in the second direction Y across the process chambers Pc1, Pc2, Pc3, Pc4, Pc5, and Pc6 is positioned in the mask storage chambers Mc. The mask Ms may be positioned on an entire surface of the treatment surface of the substrate Sw when film formation is performed on a treatment surface of the transporter Cs transported to a predetermined position in the process chambers Pc1, Pc2, Pc3, Pc4, Pc5, and Pc6 along each of the subtransport paths Sr1 and Sr2. The mask Ms may include a metal, such as silver, aluminum, or stainless steel, and may have an opening (not illustrated) formed to penetrate in a thickness direction according to a pattern to be formed on the treatment surface of the substrate Sw.

A second gate valve Gv2 may be installed outside the mask storage chamber Mc to open the mask storage chamber Mc with the first gate valve Gv1 closed, and to open the second gate valve Gv2 to exchange the mask Ms therein.

The mask Ms may be attached to the treatment surface of the substrate Sw by known detachment members equipped with an electromagnet or a permanent magnet in the case of forming a film through the mask Ms on the treatment surface of the transporter Cs transported to each of the process chambers Pc1, Pc2, Pc3, Pc4, Pc5, and Pc6.

Although not illustrated, imaging members, such as a CCD camera, is installed in the process chambers Pc1, Pc2, Pc3, Pc4, Pc5, and Pc6 to relatively move a position of the mask Ms relative to the treatment surface of the substrate Sw by using image data captured by photographing members, thereby aligning the substrate Sw and the mask Ms As described above, the turnback chamber Bc connected through the fifth connection passage Pw5 and the sixth connection passage Pw6 is positioned on a side surface side of the third transport chamber Tc3 among the transport chambers Tc1, Tc2, and Tc3.

The turnback chamber Bc includes a rotation stage 41, which is a carrier transport member, and a turnback transport path 42 extending in the first direction X along the first main transport path Mr1 and the second main transport path Mr2 is positioned in the rotation stage 41.

As illustrated in FIG. 1, when the rotation stage 41 is rotated by the transporter Cs in a state of a first position transported through the first main transport path Mr1 from the third transport chamber Tc3, the third transport chamber Tc3 and the transporter Cs may be exchanged through the second main transport path Mr2 while the transporter Cs maintains the first position. In this case, the treatment surface of the transporter Cs may face an inner surface of each chamber.

In addition, the first position conversion chamber Ac1 and the second position conversion chamber Ac2 are connected to the carrier transport chamber Cc through a third gate valve Gv3. The carrier transport chamber Cc includes a carrier transport member 5, to return an empty carrier Ca having a first positional state under a vacuum atmosphere or a controlled atmosphere between the end position Ep and the start position Sp.

The carrier transport member 5 of the carrier transport chamber Cc includes a rotation stage 51 and a carrier turnback transport path 52 extending in the first direction X along the first main transport path Mr1 and the second main transport path Mr2 is positioned in the rotation stage 51.

When the rotation stage 51 is rotated by receiving the empty carrier Ca returned from the end position Ep of the second main transport path Mr2 of the second position conversion chamber Ac2, the empty carrier Ca may be transported to the starting position Sp of the first main transport path Mr1. In addition, preprocessing members (not illustrated) for performing preprocessing, such as surface cleaning or static electricity removal on the empty carrier Ca may be installed in the carrier transport chamber Cc. The preprocessing members may be changed, and a detailed description thereof will be omitted.

Then, a deposition method of stacking a plurality of thin films while passing through the plurality of process chambers Pc1, Pc2, Pc3, Pc4, Pc5, and Pc6 in order will be described with reference to FIG. 2 to FIG. 4 as well as FIG. 1

Figure 2:
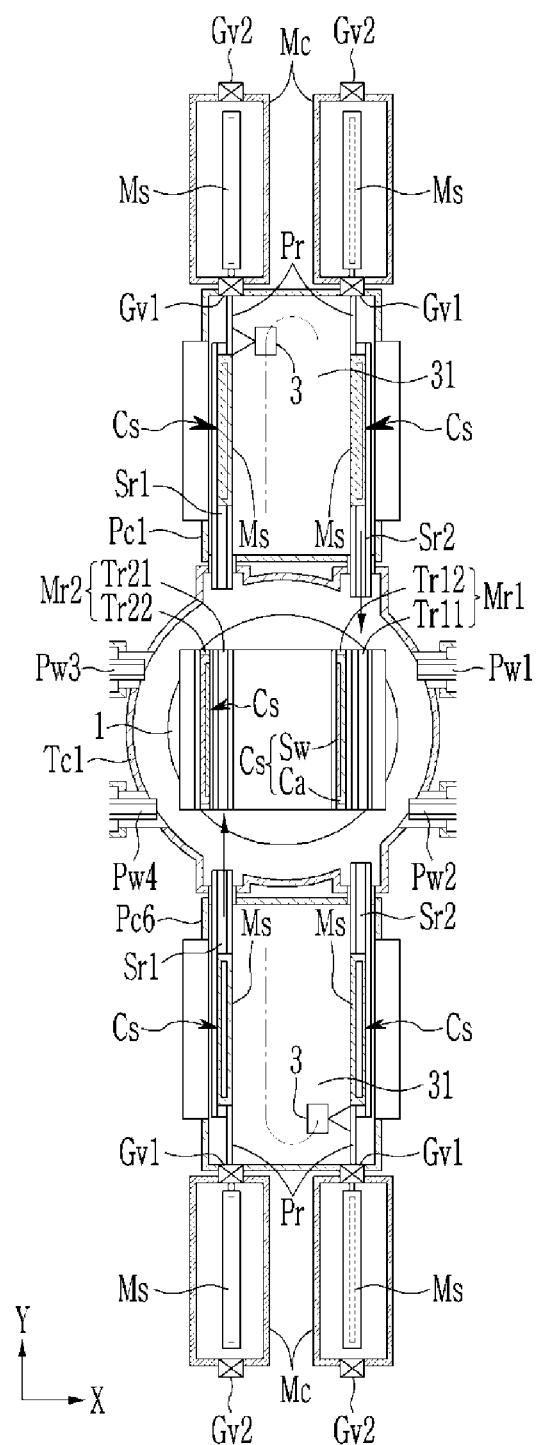
FIG. 2 illustrates a portion of a vacuum processing apparatus illustrated in FIG. 1.

FIG. 2 illustrates a portion of a vacuum processing apparatus illustrated in FIG. 1; FIG. 3 illustrates a portion of a vacuum processing apparatus illustrated in FIG. 1; and FIG. 4 illustrates a portion of a vacuum processing apparatus illustrated in FIG. 1.

For simplicity of explanation, it is assumed that, as shown in FIG. 1, two transporters Cs are positioned in each of the process chambers Pc1, Pc2, Pc3, Pc4, Pc5, and Pc6, a film formation process on the substrate Sw of the transporter Cs in the second subtransport path Sr2 is completed, while the film-formation process on the substrate Sw of the transporter Cs in the first subtransport path Sr1 has not yet been carried out. In addition, it is assumed that the transporters Cs are respectively positioned in the first main transport path Mr12 and the second main transport path Mr22 of the transport chambers Tc1, Tc2, and Tc3, the transporter Cs is positioned in one of the turnback transport paths 42 in the turnback chamber Bc, and an empty carrier Ca in a pre-processed state is positioned in one of the carrier turnback transport paths 52 in the carrier transport chamber Cc.

First, one substrate Sw prior to processing is carried into the first load lock chamber Lc1 while maintaining the second position, i.e., the horizontal position. In this case, the transport chamber Tc, the first position conversion chamber Ac1 and the second position conversion chamber Ac2, each of the process chamber Pc1, Pc2, Pc3, Pc4, Pc5, and Pc6, the carrier transport chamber Cc, and the turnback chamber Bc are evacuated at a predetermined pressure. In addition, the empty carrier Ca in the carrier transport chamber Cc is transported to the starting position Sp of the first position conversion chamber Ac1 through the first main transport path Mr1, and a position of the carrier Ca is changed from the first position, i.e., the vertical position, to the second position, i.e., the horizontal position. Then, the substrate Sw carried in the first load lock chamber Lc1 by the vacuum transport robot 2 is transported to the first position conversion chamber Ac1 while maintaining the second position, i.e., the horizontal position, and the substrate Sw is set on the carrier Ca to become the transporter Cs. Thereafter, a position of the transporter Cs is changed from the second position, i.e., the horizontal position to the first position, i.e., the vertical position. That is, the transporter Cs having the first position, i.e., the vertical position, is positioned at the starting position Sp, and the treatment surface of the substrate Sw faces an inner surface of the first position conversion chamber Ac1.

Next, the transporter Cs is transported toward the first transport chamber Tc1 along the first main transport path Mr1, and the transporter Cs positioned on the other main track Tr12 of the first transport chamber Tc1 after a first film formation process is completed in the first process chamber Pc1 is transported to the other main transport track Tr12 of the second transport chamber Tc2. In addition, the transporter Cs after a fifth film formation process in the fifth process chamber Pc5 is transported and positioned in the other main transport track Tr22 of the second main transport path Mr2 of the second transport chamber Tc2.

Next, the rotational movement stage 1 is rotated 90 degrees in a clockwise direction, and a state shown in FIG. 2 is obtained. In this case, the second subtransport path Sr2 of the first process chamber Pc1 is aligned with one main transport track Tr11 of the first main transport path Mr1 of the first transport chamber Tc1 in the second direction Y, and the first subtransport path Sr1 of the sixth process chamber Pc6 is aligned with one main transport track Tr21 of the second main transport path Mr2 of the first transport chamber Tc1 in the second direction Y.

Figure 3:
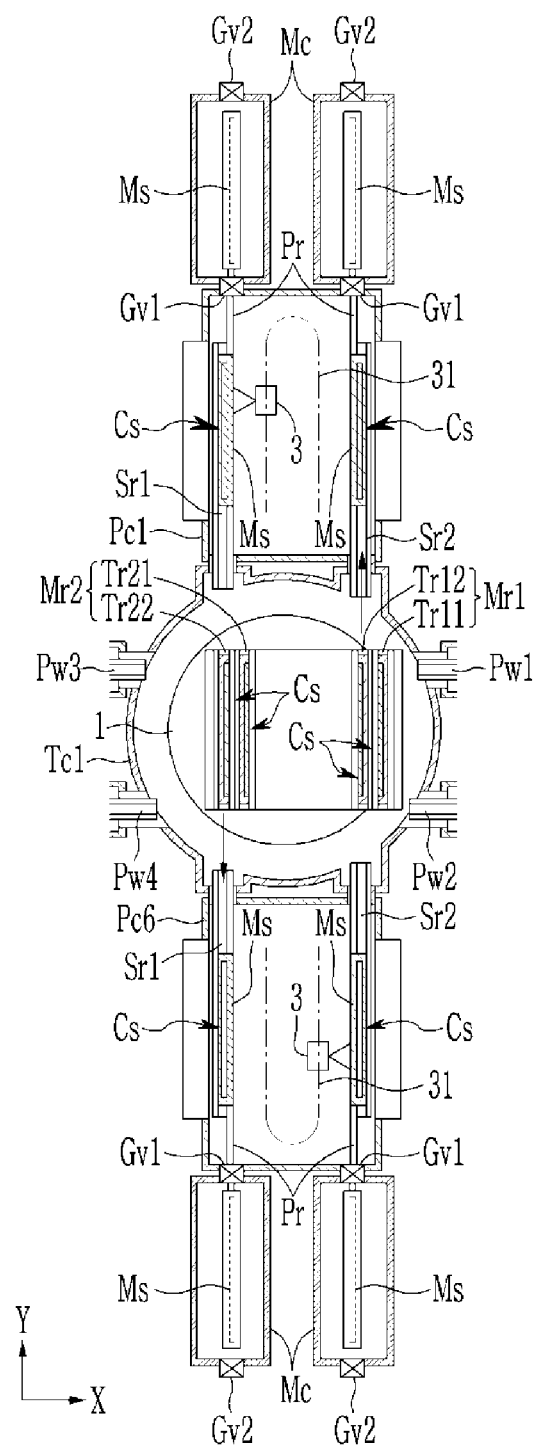
FIG. 3 illustrates a portion of a vacuum processing apparatus illustrated in FIG. 1.

Next, in the first process chamber Pc1, the transporter Cs after the first film formation process is transported from the second subtransport path Sr2 to one main transport track Tr11 of the first main transport path Mr1 of the first transport chamber Tc1, in the sixth process chamber Pc6, the transporter Cs after a sixth film formation process is transported from the first subtransport path Sr1 to one main transport track Tr22 of the second main transport path Mr2 of the first transport chamber Tc1, in this state, the first transport chamber Tc1 moves along the first direction X by a predetermined stroke length, and a state shown in FIG. 3 is obtained.

Referring to FIG. 3, the second subtransport path Sr2 of the first process chamber Pc1 is aligned with another main transport track Tr12 of the first main transport path Mr1 of the first transport chamber Tc1 in the second direction Y, and the first subtransport path Sr1 of the sixth process chamber Pc6 is aligned with another main transport track Tr22 of the second main transport path Mr2 of the first transport chamber Tc1 in the second direction Y.

Figure 4:
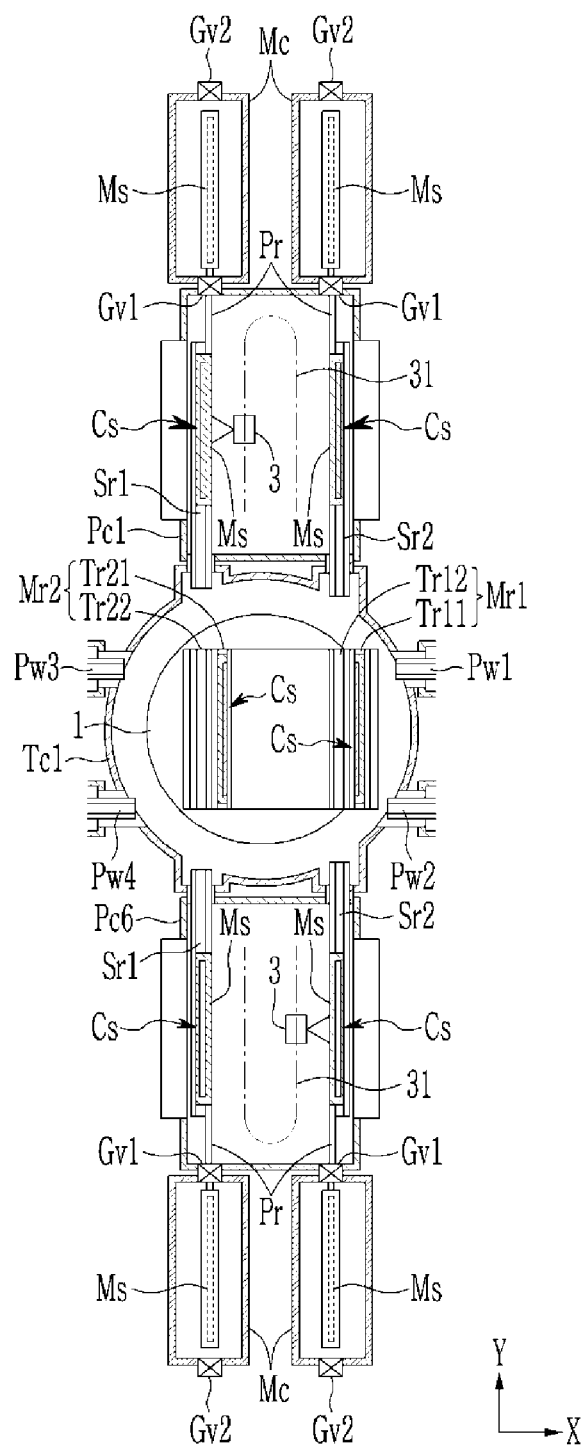
FIG. 4 illustrates a portion of a vacuum processing apparatus illustrated in FIG. 1.

The transporter Cs prior to processing is moved from another main transport track Tr12 of the first main transport path Mr1 of the first transport chamber Tc1 to the second subtransport path Sr2 and is transported to the first process chamber Pc1, and the transporter Cs after the fifth film formation process is transported from another main transport track Tr22 of the second main transport path Mr2 of the first transport chamber Tc1 along the first subtransport path Sr1 to the process chamber Pc6, and becomes a state shown in FIG. 4.

The operation described above is simultaneously performed between the other process chambers (Pc2 and Pc5, Pc3 and Pc4) and the other transport chambers (Tc2 and Tc3), at the same time, and the transporter Cs remaining in the respective process chambers Pc1, Pc2, Pc3, Pc4, Pc5, and Pc6 is appropriately subjected to a film formation process by the film forming members 3. Then, the rotational movement stage 1 is rotated by 90 degrees in a counterclockwise direction, and the above-described operation is repeated, so that the transporter Cs is sequentially transported.

On the other hand, when the transporter Cs after all the film formation processes are transported to the end position Ep in the second position conversion chamber Ac2, the transporter Cs is changed to a second position state, and the processed substrate Sw is removed from the carrier Ca by the vacuum transport robot 2. Then, the processed substrate Sw is transported from the second position conversion chamber Ac2 to the second load lock chamber Lc2 in a vacuum atmosphere while maintaining the second position state by the vacuum transport robot 2, and is recovered.

In addition, the empty carrier Ca from which the substrate Sw is separated is changed back to the first position state. That is, the carrier Ca in the first position state, i.e., the vertical position state, exists at the end position Ep. Thereafter, the third gate valve Gv3 is opened, and the carrier Ca is transported to the carrier transport chamber Cc. In this case, the carrier transport chamber Cc, the first position conversion chamber Ac1, and the second position conversion chamber Ac2 are separated from each other in an atmosphere, and preprocessing for the empty carrier Ca is performed.

According to the above embodiment, the start position Sp of the first main transport path Mr1 and the end position Ep of the second main transport path Mr2 are positioned in the first position conversion chamber Ac1 and the second position conversion chamber Ac2 connected to one transport chamber Tc1, and the carrier transport chamber Cc is connected to the end position Ep and the start position Sp, and thus, the carrier Ca from which the substrate Sw after all the film formation processes have been removed may be quickly transported from the end point position Ep to the start position Sp through the carrier transport chamber Cc. In addition, the first transport chamber Tc1 and the carrier transport chamber Cc are connected through a third gate valve Gv3, and thus, pre-processing, such as cleaning a surface of the carrier Ca and removing static electricity, is possible after separating the atmosphere of the first transport chamber Tc1 and the carrier transport chamber Cc by closing the third gate valve Gv3. In this way, the movement path of the carrier Ca may be simplified, and a decrease in the tact time may be prevented.

In addition, in each of the process chambers Pc1, Pc2, Pc3, Pc4, Pc5, and Pc6, the substrate Sw mounted on the carrier Ca is transported to the first position in a state where a number of use of the carrier Ca is reduced, various vacuum processes, such as film formation, may be efficiently performed on the treatment surface of the substrate Sw.

In addition, it is possible to carry in the transporter Cs before being processed and carry out the transporter Cs after being processed at the same time in two process chambers (Pc1 and Pc6, Pc2 and Pc5, and Pc3 and Pc4) positioned at opposite positions to each other through each of the transport chambers Tc1, Tc2, and Tc3. Accordingly, a transport time of the transporter Cs between the transport chamber Tc and each of the process chambers Pc1, Pc2, Pc3, Pc4, Pc5, and Pc6 may be reduced, thereby improving productivity.

In addition, it is possible to reduce a stop time of each of process chambers Pc1, Pc2, Pc3, Pc4, Pc5, and Pc6 for mask exchange by connecting the mask storage chamber Mc to each of the process chambers Pc1, Pc2, Pc3, Pc4, Pc5, and Pc6, thereby improving an operation rate of the vacuum processing apparatus VM1.

Figure 5:
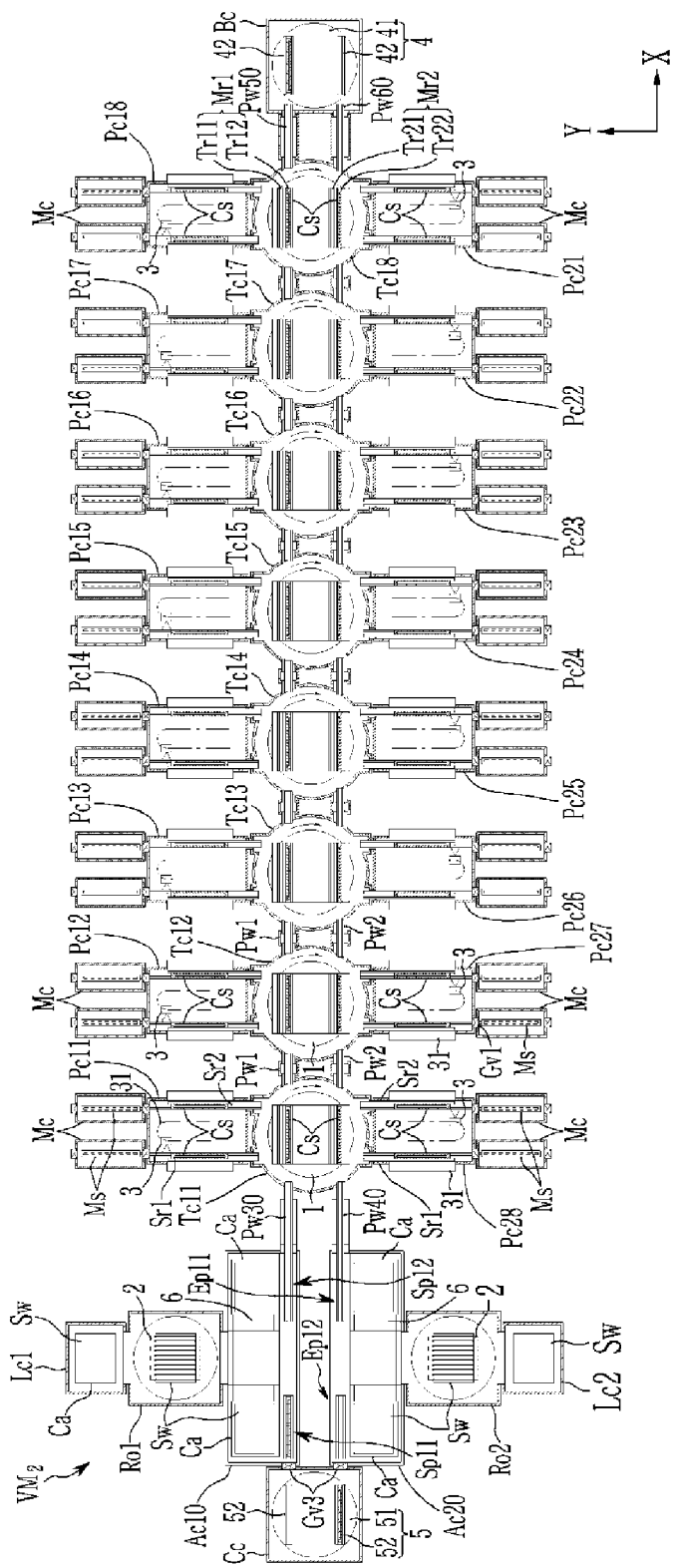
FIG. 5 illustrates a cross-sectional view of a vacuum processing apparatus according to another embodiment.

A vacuum processing apparatus VM2 according to another embodiment will be described with reference to FIG. 5. FIG. 5 illustrates a cross-sectional view of a vacuum processing apparatus according to another embodiment.

Referring to FIG. 5, a vacuum processing apparatusVM2 according to the present embodiment is similar to the vacuum processing apparatus VM1 according to the embodiment illustrated in FIG. 1. A detailed description of same constituent elements will be omitted.

Unlike the vacuum processing apparatus $VM_1$ according to the embodiment shown in FIG. 1, in accordance with the vacuum processing apparatus VM2 according to the present embodiment, a transport member 6 that is movable in the first direction X may be disposed in the first position conversion chamber Ac10, starting point positions Sp11 and Sp12 may be provided at both sides in a moving direction of the transport member 6, respectively, and the empty carrier Ca or the transporter Cs may move to a second position state, i.e., a horizontal position state between the starting positions Sp11 and Sp12. Similarly, the transport member 6 that is movable in the first direction X may be disposed in the second position conversion chamber Ac20, end positions Ep11 and Ep12 may be provided at both sides in the moving direction of the transport member 6, respectively, and the empty carrier Ca or the carrier Cs may move to the second position state, i.e., the horizontal position state between the end positions Ep11 and Ep12.

In the first position conversion chamber Ac10 and the second position conversion chamber Ac20, the carrier transport chamber Cc capable of transporting the empty carrier Ca in a first position state, i.e., a vertical position state in a vacuum atmosphere or in a controlled atmosphere from the end point position Ep12 to the start point position Sp11, is connected through the third gate valve Gv3.

In addition, the first position conversion chamber Ac10 and the second position conversion chamber Ac20 are connected to the first transport chamber Tc11 through connection passages Pw30 and Pw40 serving as a buffer chamber. In addition, a plurality of transport chambers Tc11, Tc12, Tc13, Tc14, Tc15, Tc16, Tc17, and Tc18 are sequentially connected through the first connection passage Pw1 and the second connection passage Pw2.

The process chambers Pc11 to Pc18 and Pc28 to Pc21 are sequentially connected to face each other along the second direction Y on outer surfaces of the transport chambers Tc11, Tc12, Tc13, Tc14, Tc15, Tc16, Tc17, and Tc18.

The turnback chamber Bc is connected through connection passages Pw50 and Pw60 serving as the buffer chamber on an outer surface of the eighth transport chamber Tc18 in the first direction X positioned farthest from the first transport chamber Tc11 along the first direction X.

According to the present embodiment, process chambers, e.g., the process chambers Pc11 and Pc12, Pc13 and Pc14, Pc15 and Pc16, Pc17 and Pc18, Pc28 and Pc27, Pc26 and Pc25, Pc24 and Pc23, and Pc22 and Pc21 that are adjacent to each other along the first direction X may be formed by using a same film formation material. The transporter Cs in the starting position Sp12 and the transporter Cs in the buffer chamber Pw30 are transported to the first transport chamber Tc11 and the second transport chamber Tc12 in the first position state, respectively, and at the same time, the transporters Cs on which a first film formation process has been performed in the first process chamber Pc11 and the second process chamber Pc12 are transported from the first transport chamber Tc11 to the third process chamber Pc13 through the third transport chamber Tc13, and are transported from the second transport chamber Tc12 to the fourth process chamber Pc14 through the fourth transport chamber Tc14.

As such steps are repeated, the transporter Cs after all the film formation processes in the sixteenth process chamber Pc28 is transported to the end position Ep11 through the first transport chamber Tc11, and the transporter Cs after all the film formation processes in the fifteenth process chamber Pc27 are transported to the buffer chamber Pw40 through the second transport chamber Tc12.

According to the embodiment described above with reference to FIG. 1, it has been described as an example that the substrate Sw is set on the carrier Ca in the first position conversion chamber Ac1, and at the same time, the substrate Sw is separated from the carrier Ca in the second position conversion chamber Ac2, but the embodiment is not limited thereto.

According to the above-described embodiments, although a predetermined vacuum process has been described as an example of a film formation process, the inventive concepts are not limited thereto, and any treatment, such as heat treatment or etching treatment, may be applied regardless of contents of the treatment as well as it is performed in a vacuum atmosphere. In addition, the number of connected process chambers is not limited to the above-described embodiment. In addition, a mask Ms is placed in each of the process chambers Pc1, Pc2, Pc3, Pc4, Pc5, and Pc6, and although it has been described as an example that the mask Ms is returned to the mask storage chamber Mc only when the mask Ms is exchanged, the inventive concepts are not limited thereto, and when the transporter Cs is transported to each of the process chambers Pc1, Pc2, Pc3, Pc4, Pc5, and Pc6, the mask Ms may be transported from the mask storage chamber Mc.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A vacuum processing apparatus comprising:
a plurality of transport chambers arranged in order along a first direction;
a plurality of process chambers connected to the transport chambers along a second direction perpendicular to the first direction; and
a position conversion chamber connected to a first transport chamber of the transport chambers,
wherein the transport chambers include a rotational movement stage that rotates about a rotation axis that is perpendicular to the first direction and the second direction, and moves along a plane formed by the first direction and the second direction
wherein:
the transport chambers are connected to each other through a first connection passage and a second connection passage that are spaced along the second direction; and
the position conversion chamber includes a first position conversion chamber connected to the first transport chamber through a third connection passage that is aligned with the first connection passage along the first direction, and a second position conversion chamber connected to the first transport chamber through a fourth connection passage that is aligned with the second connection passage along the first direction.

2. The vacuum processing apparatus of claim 1, further comprising:
a starting position positioned in the first position conversion chamber; and
an end position positioned within the second position conversion chamber.

3. The vacuum processing apparatus of claim 2, wherein a carrier on which a substrate is mounted sequentially passes through the transport chambers along the first direction from the starting position positioned in the first position conversion chamber, then passes through the transport chambers in reverse order along a direction that is opposite to the first direction, and then is transported to the end position positioned in the second position conversion chamber.

4. The vacuum processing apparatus of claim 3, wherein:
the transport chambers include a first main transport path and a second main transport path, which are positioned on the rotational movement stage and are spaced apart from each other;
the first main transport path includes a first main transport track and a second main transport track that are separated from each other; and
the second main transport path includes a third main transport track and a fourth main transport track that are spaced apart from each other.

5. The vacuum processing apparatus of claim 4, wherein:
the process chambers include a first process chamber and a second process chamber that are separated from each other along the second direction and connected to the first transport chamber;
the first process chamber and the second process chamber each include a first subtransport path and a second subtransport path; and
by first rotation of the rotational movement stage, the second subtransport path of the first process chamber is aligned with the first main transport track in the second direction, and the first subtransport path of the second process chamber is aligned with the third main transport track of the first transport chamber in the second direction.

6. The vacuum processing apparatus of claim 5, wherein, by movement of the rotational movement stage, the second subtransport path of the first process chamber is aligned with the second main transport track in the second direction, and the first subtransport path of the second process chamber is aligned with the fourth main transport track of the first transport chamber in the second direction.

7. The vacuum processing apparatus of claim 1, wherein:
the position conversion chamber includes a first position conversion chamber and a second position conversion chamber;
the vacuum processing apparatus further includes a first load lock chamber connected to the first position conversion chamber and a carrier transport chamber connected to the first position conversion chamber;
a carrier is transported from the carrier transport chamber to the first position conversion chamber in a first position state with a surface facing the first direction or the second direction, and then the carrier is changed from the first position state to a second position state in which the surface faces a plane formed by the first direction and the second direction in the first position conversion chamber,
a substrate to be processed is carried into the first load lock chamber in the second position state in which a treatment surface of the substrate faces a plane formed by the first direction and the second direction, and then is transported to the first position conversion chamber, and
the substrate is mounted on the carrier in the first position conversion chamber.

8. The vacuum processing apparatus of claim 7, wherein the substrate and the carrier are changed from the second position state to the first position state in the first position conversion chamber.

9. The vacuum processing apparatus of claim 8, wherein the transport chambers and the process chambers include paths in which the substrate and the carrier are moved while maintaining the first position state.

10. The vacuum processing apparatus of claim 9, further comprising a second load lock chamber connected to the second position conversion chamber,
wherein:
the substrate and the carrier are transported to the second position conversion chamber through the first transport chamber to change from the second position state to the first position state within the second position conversion chamber; and
the substrate and the carrier, which have been repositioned to the first position state, are separated, to transport the substrate to the second load lock chamber and the carrier to the carrier transport chamber.

11. The vacuum processing apparatus of claim 1, further comprising:
a plurality of mask storage chambers connected to the process chambers; and a mask return path arranged between the process chambers and the mask storage chambers.

12. The vacuum processing apparatus of claim 1, further comprising a turnback chamber connected to a second transport chamber that is most spaced apart from the first transport chamber along the first direction among the transport chambers,
   wherein the turnback chamber includes a rotation stage and a turnback transport path arranged on the rotation stage.

13. A vacuum processing apparatus comprising:
   a plurality of transport chambers arranged in order along a first direction;
   a plurality of process chambers connected to the transport chambers along a second direction perpendicular to the first direction; and
   a position conversion chamber connected to a first transport chamber of the transport chambers,
   wherein the transport chambers include a rotational movement stage that rotates about a rotation axis that is perpendicular to the first direction and the second direction, and moves along a plane formed by the first direction and the second direction,
   the transport chambers include a first main transport path and a second main transport path, which are positioned on the rotational movement stage and are spaced apart from each other,
   the first main transport path includes a first main transport track and a second main transport track that are separated from each other, and
   the second main transport path includes a third main transport track and a fourth main transport track that are spaced apart from each other.

* * * * *